United States Patent
Takizawa et al.

(10) Patent No.: US 11,695,366 B2
(45) Date of Patent: Jul. 4, 2023

(54) SHORT CIRCUIT DETECTION DEVICE, AND SHORT CIRCUIT DETECTION METHOD FOR ROTATING ELECTRIC MACHINE

(71) Applicant: Mitsubishi Electric Corporation, Tokyo (JP)

(72) Inventors: Yuji Takizawa, Tokyo (JP); Haruyuki Kometani, Tokyo (JP); Ryosuke Kawashima, Tokyo (JP); Kohei Majima, Tokyo (JP); Susumu Maeda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/771,819

(22) PCT Filed: Jan. 27, 2020

(86) PCT No.: PCT/JP2020/002705
§ 371 (c)(1),
(2) Date: Apr. 26, 2022

(87) PCT Pub. No.: WO2021/152649
PCT Pub. Date: Aug. 5, 2021

(65) Prior Publication Data
US 2022/0376645 A1    Nov. 24, 2022

(51) Int. Cl.
*H02P 29/024* (2016.01)
*G01R 31/34* (2020.01)

(52) U.S. Cl.
CPC ......... *H02P 29/024* (2013.01); *G01R 31/346* (2013.01)

(58) Field of Classification Search
CPC ...... H02P 29/024; G01R 31/346; G01R 31/52
USPC .................................................. 324/765.01
See application file for complete search history.

(56) References Cited

U.S. PATENT DOCUMENTS

2011/0234181 A1* 9/2011 Hobelsberger .......... H02P 29/00
322/99

FOREIGN PATENT DOCUMENTS

JP    2012-506686 A    3/2012

OTHER PUBLICATIONS

International Search Report and Written Opinion dated Mar. 10, 2020, received for PCT Application PCT/JP2020/002705, Filed on Jan. 27, 2020, 8 pages including English Translation.

* cited by examiner

*Primary Examiner* — Farhana A Hoque
(74) *Attorney, Agent, or Firm* — Xsensus LLP

(57) ABSTRACT

Provided are a short circuit state analyzer to compare difference value when the AC excitation current is applied at a first frequency with a threshold value, to estimate a short circuit resistance from the difference value based on data indicating a relationship between the short circuit resistance and the difference value at the first frequency when the difference value is smaller than the threshold value, to cause an excitation power supply to apply the AC excitation current to the field windings at a second frequency lower than the first frequency when the difference value is equal to or greater than the threshold value, and to estimate the short circuit resistance from a difference value obtained by the AC excitation current at the second frequency based on data indicating a relationship between the short circuit resistance and the difference value at the second frequency.

12 Claims, 9 Drawing Sheets

$$Z = \sum_{n=1}^{m} \{(A_n \times R + B_n)^{(-C_n \times R + D_n)}\}$$

$$\approx (0 \times R + B_1)^{(-C_1 \times R + D_1)} + (A_2 \times R + 0)^{(-0 \times R - 1)} \quad \cdots (E1)$$

$$\approx \underbrace{\begin{matrix} B_1^{D_1} & \cdots \text{function(1)}: \text{corresponding to Region RdL} \\ B_1^{(-C_1 \times R + D_1)} & \cdots \text{function(2)}: \text{corresponding to Region Rcr} \\ \dfrac{1}{A_2 \times R} & \cdots \text{function(3)}: \text{corresponding to Region Rdr} \end{matrix}}$$

FIG. 7

SHORT CIRCUIT DETECTION DEVICE, AND SHORT CIRCUIT DETECTION METHOD FOR ROTATING ELECTRIC MACHINE

CROSS-REFERENCE TO RELATED APPLICATION

The present application is based on PCT filing PCT/JP2020/002705, filed Jan. 27, 2020, the entire contents of which is incorporated herein by reference.

TECHNICAL FIELD

The present application relates to a short circuit detection device and a short circuit detection method for a rotating electric machine.

BACKGROUND ART

A device or a method for detecting an occurrence of a short circuit in a rotating electric machine such as a turbine generator is disclosed in which an impedance from a voltage and a current when an AC excitation current is applied to field windings is calculated (refer to, for example, Patent Document 1).

CITATION LIST

Patent Document

Patent Document 1: Japanese Unexamined Patent Application Publication (Translation of PCT Application) No. 2012-506686 (Paragraphs 0022 to 0034, FIG. 1, and FIG. 4)

SUMMARY OF INVENTION

Problems to be Solved by Invention

However, the conventional method for calculating the impedance has low accuracy and only determines presence or absence of the short circuit occurrence, and thus it is difficult to quantitative understanding of the short circuit state.

The present application discloses a technique for solving the above-mentioned problem, and an object thereof is to quantitatively evaluate a short circuit state in a rotating electric machine.

Means for Solving Problems

A short circuit detection device disclosed in the present application includes an excitation power supply to apply an AC excitation current at a predetermined frequency to field windings installed in a rotating electric machine, a difference calculation unit to calculate a difference value between a measurement value of a voltage or an impedance in the field windings to which the AC excitation current is applied and a value when the AC excitation current is applied while the field windings are in a sound state, and a short circuit state analysis unit to compare the difference value when the AC excitation current is applied at a first frequency with a threshold value, to estimate a short circuit resistance from the difference value based on data indicating a relationship between the short circuit resistance and the difference value at the first frequency when the difference value is smaller than the threshold value, the short circuit resistance being an index of a degree of a short circuit occurring between layers of the field windings, to cause the excitation power supply to apply the AC excitation current to the field windings at a second frequency that is lower than the first frequency when the difference value is equal to or greater than the threshold value, and to estimate the short circuit resistance from a difference value obtained by the AC excitation current at the second frequency based on data indicating the relationship between the short circuit resistance and the difference value at the second frequency.

Further, a short circuit detection method for the rotating electric machine that is disclosed in the present application includes an excitation step of applying an AC excitation current to the field windings installed in the rotating electric machine at a predetermined frequency, a difference calculation step of calculating a difference value between a measurement value of a voltage or an impedance in the field windings to which the AC excitation current is applied and a value when the AC excitation current is applied while the field windings are in a sound state, and a short circuit state analysis step of estimating the short circuit resistance based on the difference value, the short circuit resistance being an index of a degree of a short circuit that occurs between layers of the field windings, wherein, in the short circuit state analysis step, the difference value when the AC excitation current is applied at a first frequency is compared with a threshold value, the short circuit resistance is estimated from the difference value based on data indicating a relationship between the short circuit resistance and the difference value at the first frequency when the difference value is smaller than the threshold value, the excitation step is caused to execute at a second frequency that is lower than the first frequency when the difference value is equal to or greater than the threshold value, and the short circuit resistance is estimated from a difference value obtained by the AC excitation current at the second frequency based on data indicating a relationship between the short circuit resistance and the difference value at the second frequency.

Effect of Invention

According to the short circuit detection device or the short circuit detection method for the rotating electric machine, which is disclosed in the present application, since it is configured such that the short circuit resistance is estimated by a correlation depending on the frequency, the short circuit state can be quantitatively evaluated.

BRIEF DESCRIPTION OF DRAWINGS

FIG. 7 is a diagram showing simplified mathematical formulas for cases divided depending on a degree of influence by an impedance and an reactance, as a correlation between the normalized voltage difference and an estimated short circuit resistance for the modeled rotating electric machine in the short circuit detection device and a short circuit detection method for the rotating electric machine according to Embodiment 1.

MODES FOR CARRYING OUT INVENTION

Embodiment 1

Figure 1:
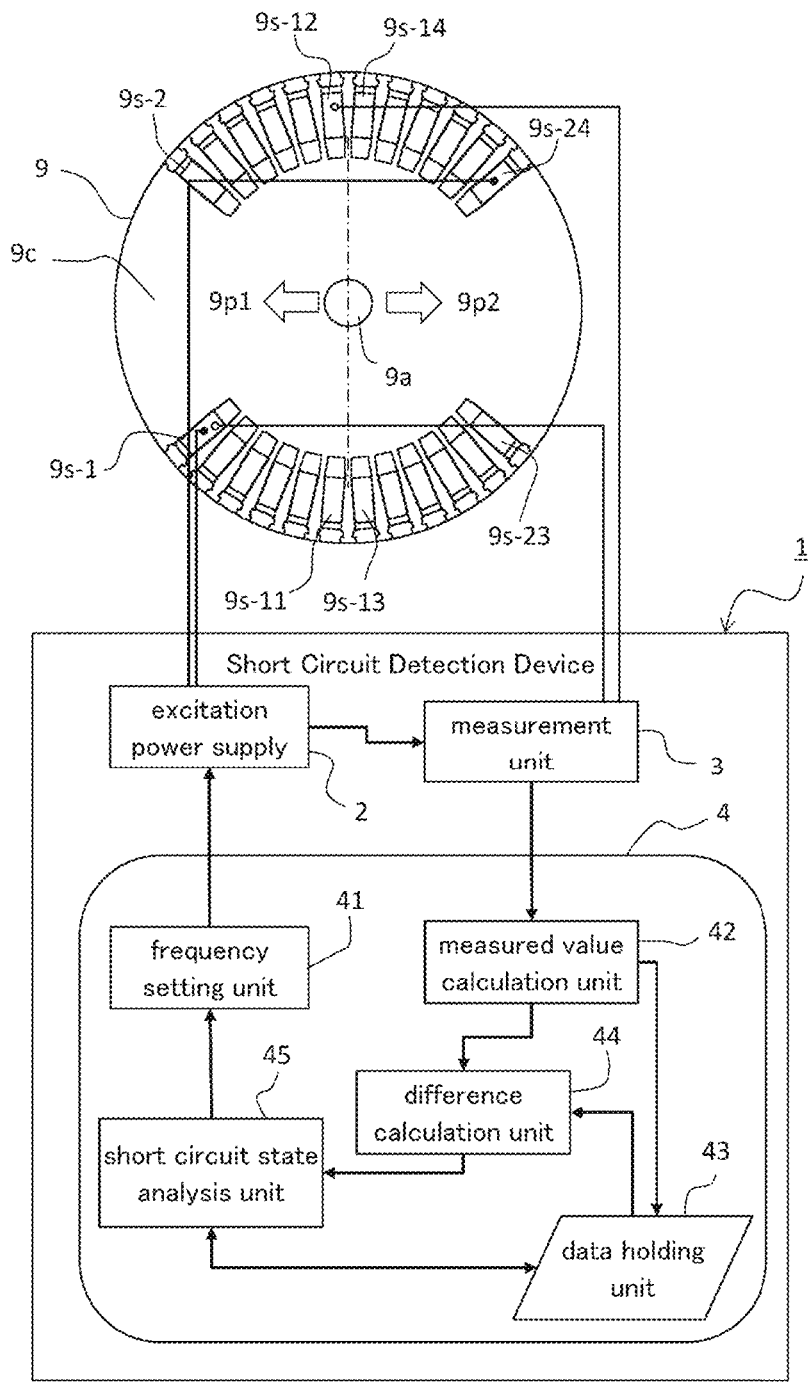
FIG. 1 is a schematic diagram showing a configuration of a short circuit detection device according to Embodiment 1.
Figure 2:
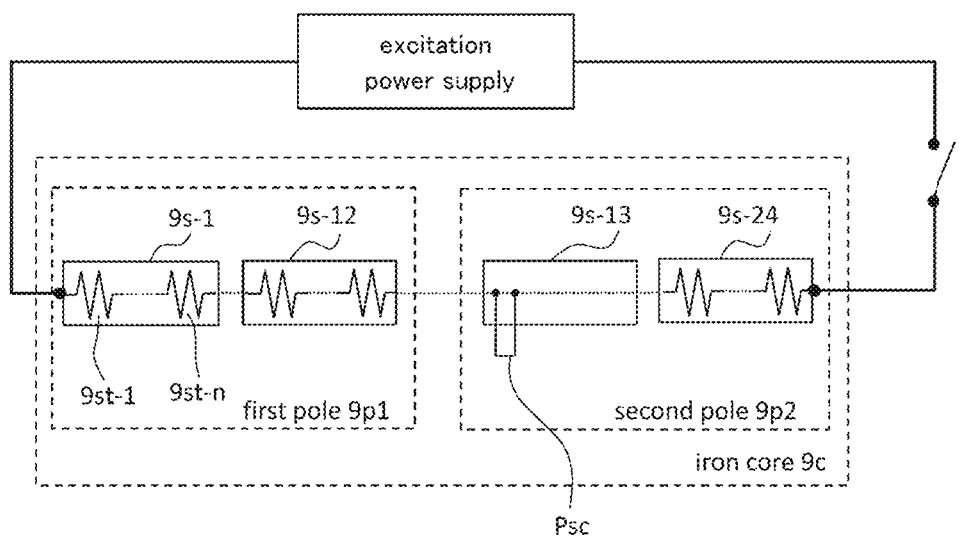
FIG. 2 is a schematic diagram in which a two-pole rotating electric machine is modeled in a state within field windings with a short circuit occurring at one pole when an AC excitation current is applied to the field windings.

FIG. 1 to FIG. 8 are diagrams for explaining a short circuit detection device and a short circuit detection method for a rotating electric machine according to Embodiment 1, and FIG. 1 is a schematic diagram showing a configuration of the short circuit detection device together with a rotor of the rotating electric machine as an evaluation target, and FIG. 2 is a schematic diagram in which a two-pole rotating electric machine is modeled in a state within field windings with a short circuit occurring at one pole when an AC excitation current is applied to the field windings.

Figure 3A:
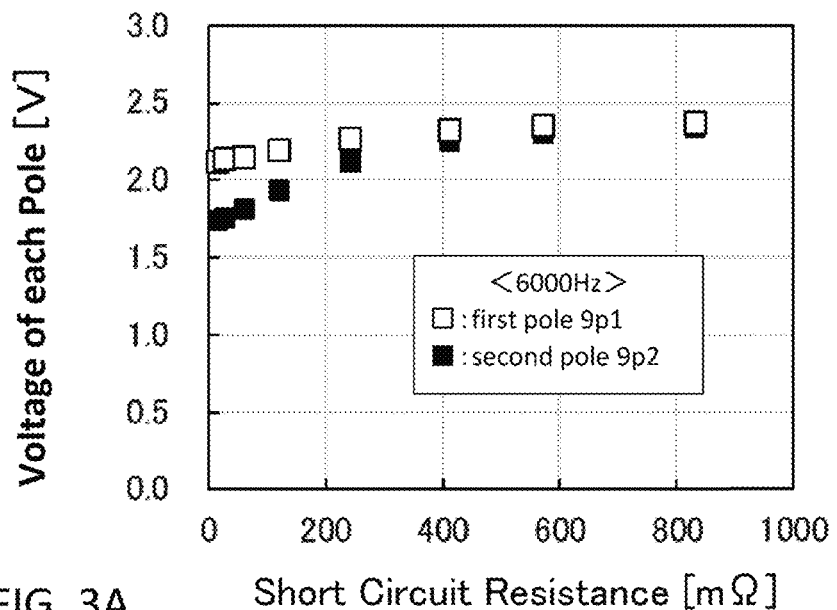
FIG. 3A and FIG. 3B are graphs showing a relationship between a short circuit resistance and a voltage of each pole and a relationship between the short circuit resistance and a voltage difference between the both poles, respectively, as results of an analysis when the AC excitation current is applied to the field windings at a first frequency in the modeled rotating electric machine.
Figure 3B:
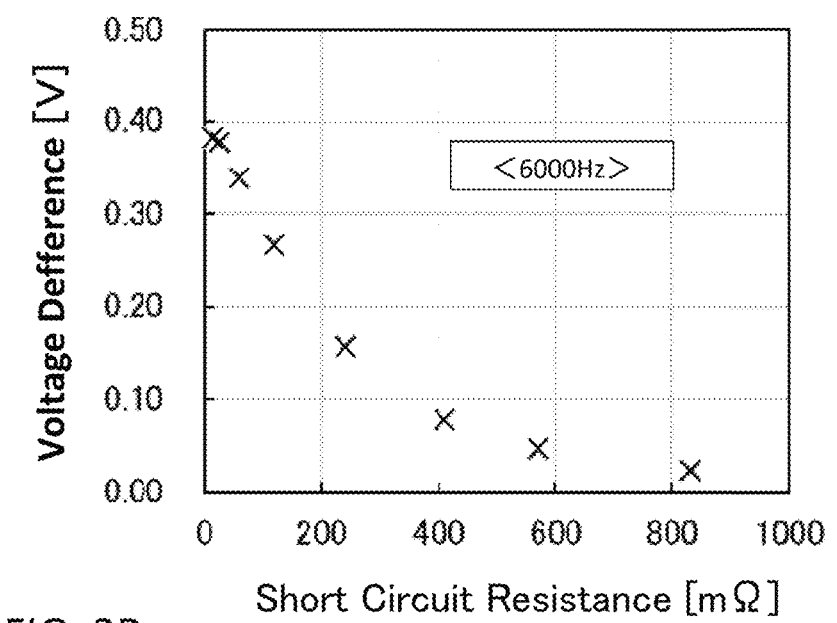
Figure 4A:
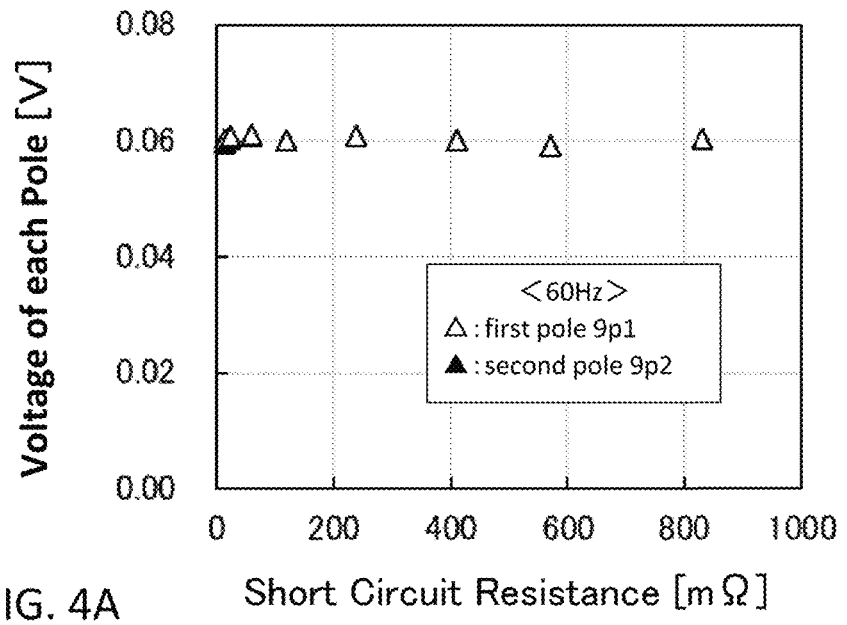
FIG. 4A and FIG. 4B are graphs showing a relationship between the short circuit resistance and a voltage of each pole and a relationship between the short circuit resistance and a voltage difference between the both poles, respectively, as results of an analysis when the AC excitation current is applied to the field windings at a second frequency in the modeled rotating electric machine.
Figure 4B:
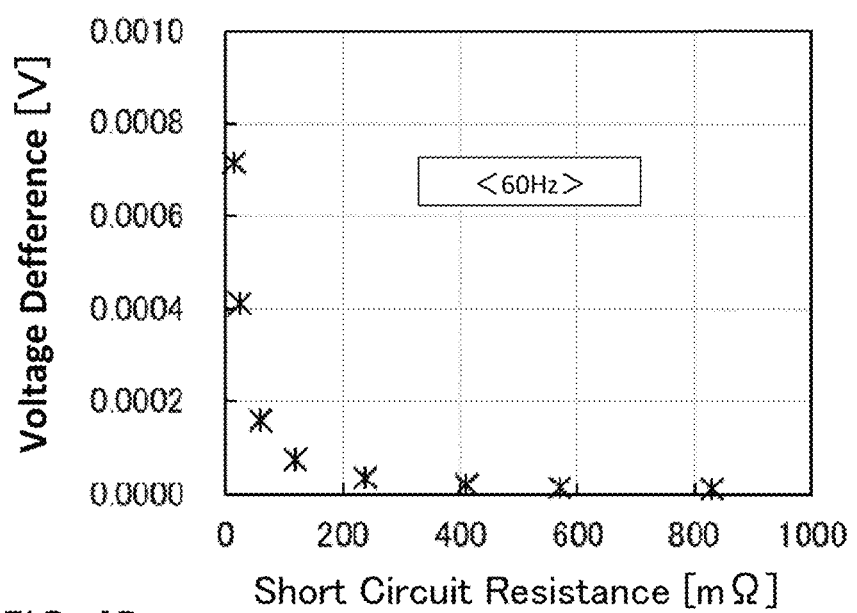

Further, FIG. 3A and FIG. 3B include graphs showing a relationship between a short circuit resistance and a voltage of each pole (FIG. 3A) and a relationship between the short circuit resistance and a voltage difference between both poles (FIG. 3B), which are results of an analysis when the AC excitation current is applied to the field windings at a first frequency of 6000 Hz in the model shown in FIG. 2. FIG. 4A and FIG. 4B include also graphs when the AC excitation current is applied to the field windings at a second frequency of 60 Hz in the model shown in FIG. 2, corresponding to FIG. 3A and FIG. 3B. FIG. 4A is a graph showing a relationship between the short circuit resistance and a voltage of each pole, and FIG. 4B is a graph showing a relationship between the short circuit resistance and a voltage difference between both poles.

Figure 5A:
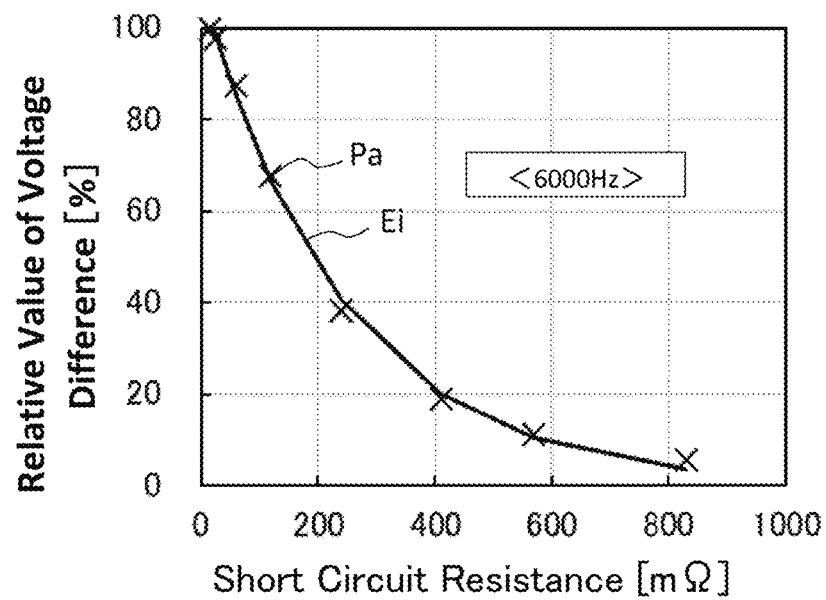
FIG. 5A and FIG. 5B show relationships between the short circuit resistance and the voltage difference between the both poles as results of an analysis when the AC excitation current is applied to the field windings at the first frequency in the modeled rotating electric machine in the form of a graph on a normal scale and on a log-log scale, respectively, the relationship being normalized by the maximum voltage difference.
Figure 5B:
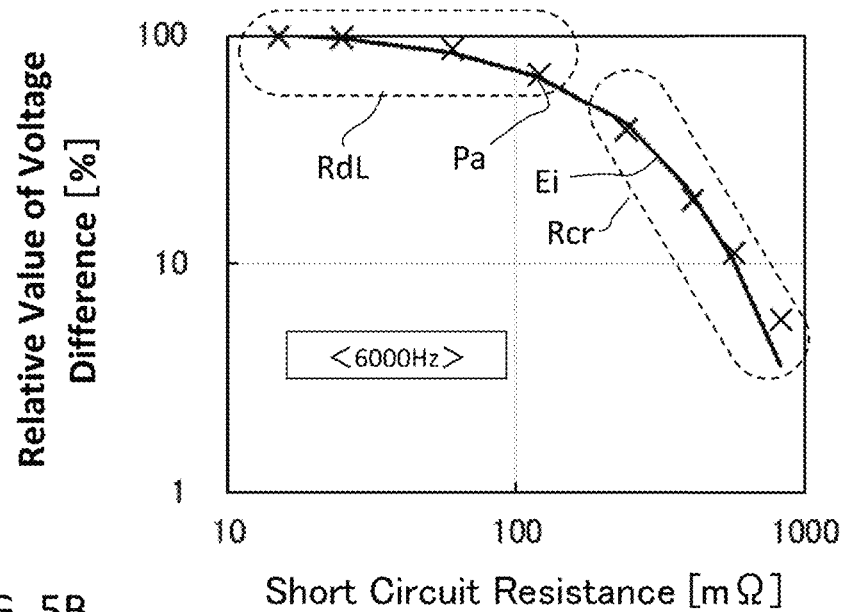
Figure 6A:
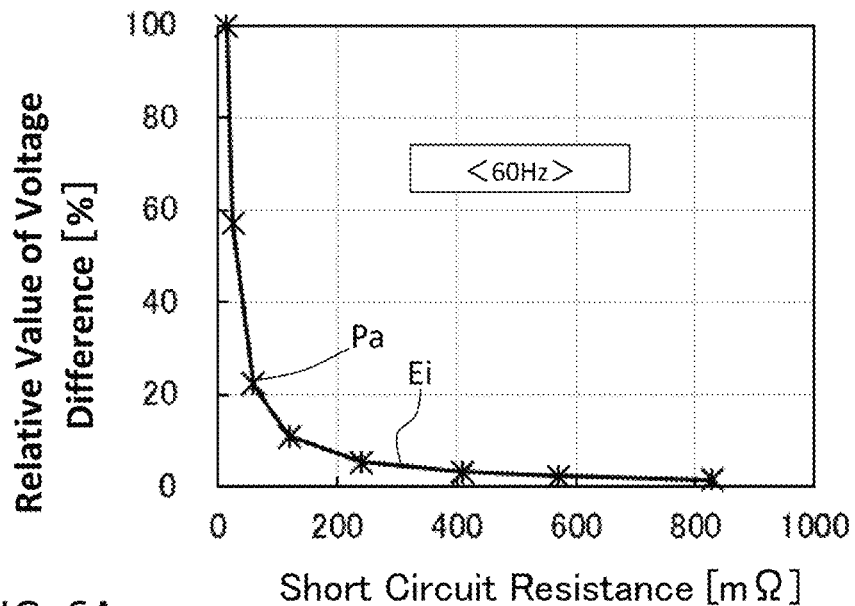
FIG. 6A and FIG. 6B show relationships between the short circuit resistance and the voltage difference between the both poles as results of an analysis when the AC excitation current is applied to the field windings at the second frequency in the modeled rotating electric machine in the form of a graph on a normal scale and on a log-log scale, respectively, the relationship being normalized by the maximum voltage difference.
Figure 6B:
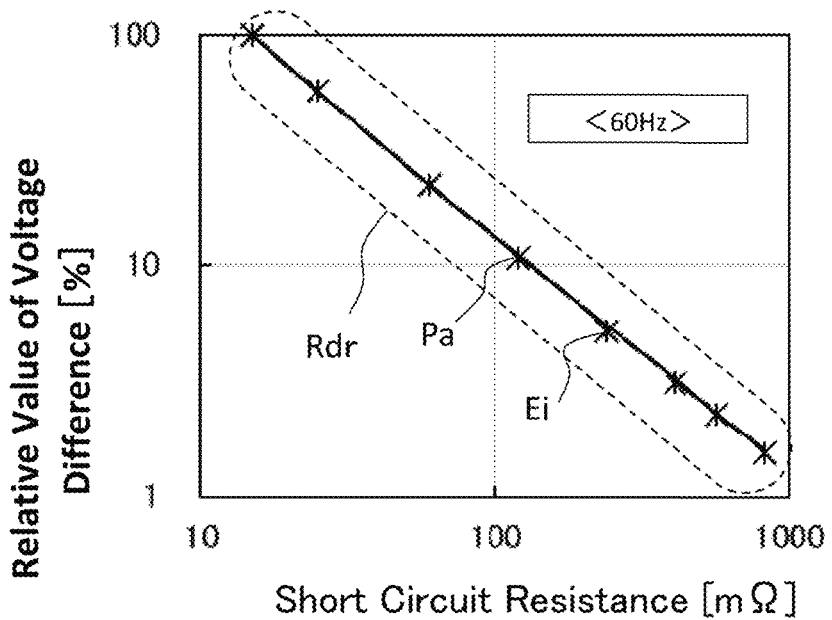
Figure 8:
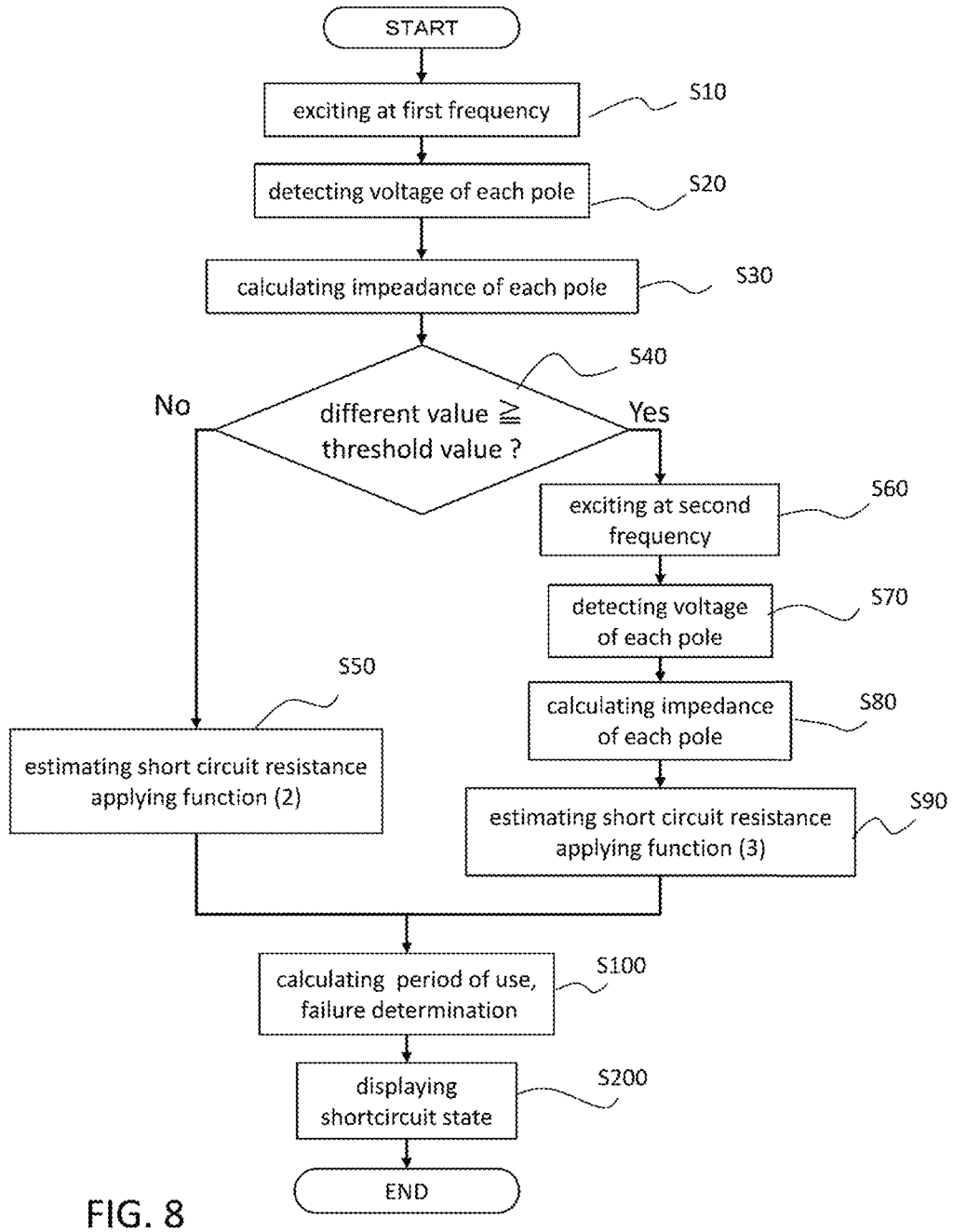
FIG. 8 is a flowchart for explaining operation of the short circuit detection device and the short circuit detection method for the rotating electric machine according to Embodiment 1.

FIG. 5 includes FIG. 5A and FIG. 5B include graphs in which the relationship between the short circuit resistance and the voltage difference between the both poles shown in FIG. 3B is normalized by the maximum voltage difference and includes a graph on a normal scale (FIG. 5A) and a graph on a log-log scale (FIG. 5B). FIG. 6A and FIG. 6B include graphs in which the relationship between the short circuit resistance and the voltage difference between the both poles shown in FIG. 4B is normalized by the maximum voltage difference and includes a graph on a normal scale (FIG. 6A) and a graph on a log-log scale (FIG. 6B). Further, FIG. 7 is a diagram showing simplified mathematical formulas for three cases divided depending on the degree of influence by an impedance and a reactance, as correlations between the normalized voltage difference and an estimated short circuit resistance that are shown in FIG. 5B and FIG. 6B. FIG. 8 is a flowchart for explaining operation of the short circuit detection device and the short circuit detection method for the rotating electric machine.

The configuration of the short circuit detection device 1 according to Embodiment 1 will be described referring to FIG. 1. Prior to a detailed description of the short circuit detection device 1, the rotor 9 of a turbine generator as the rotating electric machine will be described as an evaluation target for a short circuit. The rotor 9 includes a shaft 9a, an iron core 9c supported so as to be rotatable about the shaft 9a, and a plurality of slots 9s provided on the outer circumferential side of the iron core 9c (in the figure, some slots among the first slots 9s-1 to the 24th slots 9s-24 are indicated with individual symbols).

Note that, although the number of slots and poles is not limited, in order to simplify the description, the rotor 9 having 24 slots and two poles will be described as an example in Embodiment 1. Among the slots 9s, a group of odd-numbered slots from the first slot 9s-1 to the 23rd slot 9s-23 is arranged in a counterclockwise direction in a range of one quarter of the circumference, and a group of even-numbered slots from the second slot 9s-2 to the 24th slot 9s-24 is arranged in a clockwise direction along the circumferential direction in a range of one quarter of the circumference so as to face the group of the odd-numbered slots.

Further, in each of the slots 9s, each of the field windings is wound and housed, the field windings being connected in series from the first slot 9s-1 to the 24th slot 9s-24. Thus, the iron core 9c is divided into a first pole 9p1 (left side in the figure) having the first slot 9s-1 to the 11th slot 9s-11 and the second slot 9s-2 to the 12th slot 9s-12, and a second pole 9p2 (right side in the figure) having the 13th slot 9s-13 to the 23th slot 9s-23 and the 14th slot 9s-14 to the 24th slot 9s-24.

The short circuit detection device 1 according to Embodiment 1 includes an excitation power supply 2 for applying the AC excitation current to the field windings of the rotating electric machine, a measurement unit 3 for detecting a signal indicating a current flowing through the field windings and a signal indicating a voltage between terminals, and a control unit 4 for setting test conditions and performing an analysis of a short circuit state. The excitation power supply 2 is connected to both ends (first slot 9s-1 portion and 24th slot 9s-24 portion) of the field windings wound around the slot 9s. On the other hand, the measurement unit 3 is shown in a state in which it is connected to both ends (the first slot 9s-1 portion and the 12th slot 9s-12 portion) of the field windings of the first pole 9p1 as one of the two poles, but during the short circuit detection, the measurement unit 3 also sequentially connects to the remaining pole (the second pole 9p2).

The control unit 4 includes a frequency setting unit 41 for setting an excitation frequency by the excitation power supply 2, a measurement value calculation unit 42 for calculating measurement values such as an impedance and a voltage of the field windings in units of the pole on the basis of signals detected by the measurement unit 3, and a difference calculation unit 44 for calculating a difference value between the measurement values. Further, a short circuit state analysis unit 45 is provided for quantitatively evaluating a short circuit resistance on the basis of a correlation selected in accordance with the calculated difference value and the excitation frequency from the data held in a data holding unit 43. Note that, although it is stated that the short circuit state analysis unit 45 executes an instruction on a set frequency to the frequency setting unit 41 in accordance with an analysis result as will be described later, it may be interpreted that the frequency setting unit 41 is contained in the short circuit state analysis unit 45. Note that details of the calculation will be described together with the description on the operation.

Here, the rotating electric machine is modeled as shown in FIG. 2, and it is assumed that a short circuit does not occur in the field windings of the first pole 9p1 (hereinafter referred to as "sound pole"), and a short circuit occurs in the field windings (slot 9s-13 portion) of the second pole 9p2 (hereinafter referred to as "short-circuited pole"). The field winding of each of the slots 9s is wound with several turns, such as the first turn 9st-1 to the n-th turn 9st-n in the first slot 9s-1, and the figure shows a state in which a short circuit occurring portion Psc where the short circuit between the turns exists in the field winding of the 13th slot 9s-13 portion of the short-circuited pole (second pole 9p2).

In this state, when the AC excitation current is applied to the field windings by the excitation power supply, the excitation current from the excitation power supply flows in the remaining field windings except for the turns in the short circuit occurring portion Psc, and an excitation magnetic flux flows within the core 9c and in a leakage magnetic flux path at ends of the field windings. The excitation magnetic flux is also interlinked with a short-circuited circuit (short circuit occurring portion Psc), a large short circuit current is generated in the short-circuited circuit, and a counter magnetic flux having action of cancelling the excitation magnetic flux is generated. In the short-circuited pole, the voltage of the short-circuited pole decreases by an amount corresponding to a voltage due to the excitation magnetic flux cancelled by the counter magnetic flux as compared with the sound pole, and therefore, prior art documents and the like disclose that the presence or absence of the short circuit occurrence is detected by detecting a difference generated in the voltage or the impedance detected in both poles.

However, the voltage difference or the impedance difference caused by the short circuit includes contribution from not only a resistance component but also a reactance component. For example, when the excitation frequency is relatively high, variation of the reactance component becomes dominant in a region where the resistance component is small, and variation of the resistance component becomes dominant in a region where the short circuit resistance is relatively large. That is, the difference (voltage difference, impedance difference) between the sound pole and the short-circuited pole, caused by the short circuit, depends on the excitation frequency and the short circuit resistance at the time of the occurrence of the short circuit and does not always produced clearly. In other words, when either one of the conditions is different, the result becomes different even in the same short circuit occurrence state, thereby leading to an erroneous detection such as a detection on the basis of a value that is significantly different from a threshold value, which causes a problem in the accuracy of the short circuit detection.

In contrast, the inventor of the present application has found that the way the voltage difference (or impedance difference) produced with respect to the short circuit resistance differs depending on the excitation frequency. Specifically, at a high frequency, as described above, separation from the reactance component is necessary, which makes quantification difficult in some aspect, but it is possible to detect even a short circuit at a high resistance without missing the short circuit. On the other hand, if a short circuit occurs at a low frequency, the voltage difference to be produced is not large, and thus there is a possibility that the short circuit at a high resistance may be missed, but the effect of the reactance component is small, the relationship between the short circuit resistance and the voltage difference is inversely proportional, and thus quantification can be easily made.

That is, it has been found that the short circuit resistance can be accurately and quantitatively evaluated as an index showing the degree of the short circuit occurring between the turns (between layers) of the field windings, regardless of the magnitude of the short circuit resistance, by measurement through switching the excitation frequency. Therefore, in the short circuit detection device 1 or the short circuit detection method for the rotating electric machine according to Embodiment 1, the short circuit resistance is quantitatively estimated by switching a mathematical function for calculating the short circuit resistance from the voltage difference (or impedance difference) in accordance with the excitation frequency. Since the short circuit resistance can be estimated quantitatively, it is possible to monitor time series variations of the short circuit state or to understand the usable period until the state reaches a state where heat generation or the like becomes a problem.

As the characteristic, a relationship in the voltage of each pole or the voltage difference, with respect to the short circuit resistance, when the AC excitation current is applied to the field windings at two frequencies of 6000 Hz and 60 Hz for the rotating electric machine of the model shown in FIG. 2, will be described. Here, using the short circuit resistance as a parameter, the voltage of each pole was calculated by an analysis under eight conditions where the short circuit resistance was different.

Due to the reactance component depending on the excitation frequency in a field winding circuit, the level of an absolute value in the voltage of each pole (FIG. 3A and FIG. 4A) and in the voltage difference (FIG. 3B and FIG. 4B) on the vertical axis is greatly different at frequencies of 6000 Hz and 60 Hz. Note that, more precisely, the reactance component is affected by two factors: the skin depth in the iron core 9c and the magnetoresistance due to the leakage flux passing through a non-magnetic material portion including an air region. Therefore, the reactance component is not completely proportional to the excitation frequency.

In any case, since the absolute values in the voltage and in the voltage difference on the vertical axis differ depending on the excitation frequency, it is clear that a simple comparison with the threshold may result in an erroneous detection, depending on the excitation frequency to be used in the measurement. Further, in order to examine the voltage difference in detail, the relationships between the short circuit resistance and the voltage difference shown in FIG. 3B and FIG. 4B will be described using FIG. 5A, FIG. 5B and FIG. 6A, FIG. 6B that are replotted using relative values with respect to the voltage difference at the analysis point under the condition where the short circuit resistance is the lowest.

Of FIG. 5A, FIG. 5B and FIG. 6A, FIG. 6B, only by comparing FIG. 5A and FIG. 6A in which the voltage difference in FIG. 3B and FIG. 4B is converted into a relative value and replotted on a normal scale, the difference of the characteristic in an interpolation function Eid obtained by interpolating eight analysis points Pa is not clear. However, when comparing FIG. 5B and FIG. 6B, which are respectively plots of FIG. 5A and FIG. 6A on a log-log scale, it can be seen that there is a difference between 6000 Hz and 60 Hz in the relationship between the short circuit resistance and the voltage difference.

At the AC excitation current of 6000 Hz shown in FIG. 5B, in a low-resistance region RdL where a large short circuit current flows through the short-circuited circuit, the impedance of the field winding circuit is dominated by the reactance component rather than the resistance component, so that the voltage difference is substantially constant and becomes a large value regardless of the magnitude of the short circuit resistance. In contrast, in a region Rcr where resistances are higher than those in the region RdL, the resistance component cannot be ignored and the short circuit current flows only slightly, so that the dependence of the voltage difference on the short circuit resistance increases and the voltage difference decreases as the short circuit resistance increases.

On the other hand, in the AC excitation current of 60 Hz shown in FIG. 6B, since the excitation frequency is low, the entire region is a region Rdr where the voltage difference is inversely proportional to the short circuit resistance regardless of the magnitude of the short circuit resistance. This is because the impedance of the field winding circuit is mainly the resistance component rather than the reactance component.

When the short circuit resistance is R and the relative value of the voltage difference is Z, the interpolation function Ein common in FIG. 5A, FIG. 5B and FIG. 6A, FIG. 6B can be represented as a polynomial expression (formula (E1)) shown in FIG. 7, Note that, in the formula (E1), $A_n$, $B_n$, $C_n$, and $D_n$ are arbitrary real numbers.

Here, in the region Rdr in which the resistance component is dominant at a low frequency, $C_n=0$ and $D_n=-1$, and Z can be expressed by a function (3) having a relationship inversely proportional to the short circuit resistance R. On the other hand, in the reactance dependent case at a high frequency, $A_n=0$. In this case, in the region RdL in which the short circuit resistance R is low, Z can be expressed by a function (1) that is a constant value, and in the region Rcr in which the short circuit resistance R is high, Z can be expressed by a function (2) in which the voltage difference decreases exponentially with an increase in the short circuit resistance.

That is, the formula (E1) can universally represent the relationship between the voltage difference or the impedance difference, with respect to the short circuit resistance, in the range of 60 to 6000 Hz where the influence of the reactance component and the resistance component changes. That is, by preparing the comparison data in advance as mathematical expression data or numerical value data, the short circuit resistance can be estimated quantitatively from the voltage difference, the impedance difference, and the like measured by switching the excitation frequency. Furthermore, by performing simultaneous multi-point measurement at a plurality of excitation frequencies, it is possible to improve the estimation accuracy of the short circuit resistance even for the voltage differences and the impedance differences in different absolute values. Note that Z in the formula (E1) is not limited to the voltage difference, and the short circuit resistance can be evaluated in the same manner even when it is converted into the impedance difference.

Next, the operation of the short circuit detection device 1 configured on the basis of the above knowledge, that is, the short circuit detection method for the rotating electric machine, will be described referring to the flowchart of FIG. 8. First, the frequency setting unit 41 sets the excitation frequency to 6000 Hz as a frequency on the high-frequency side (first frequency), whose sensitivity to the short circuit is high, on the basis of an instruction from the short circuit state analysis unit 45. The excitation power supply 2 applies the AC excitation current to the field windings at the first frequency that is set (step S10). Then, the measuring unit 3 detects a signal indicating the current value at the time from the excitation power supply 2 and detects a signal indicating a value of the voltage generated in each of the first pole 9p1 and the second pole 9p2 from the connected terminals (step S20). At this time, as shown in FIG. 1, the measurement may be performed for each of the poles or simultaneously for both poles.

The measurement value calculation unit 42 calculates the impedance of each pole using the current signal and the voltage signal output from the measurement unit 3, and the difference calculation unit 44 calculates the difference value (step S30). Here, as described in FIG. 2, when the short circuit occurs only in one pole (short-circuited pole), a difference in the value of the voltage occurs between the poles, and the impedance difference can be calculated. However, in the case of the high-frequency excitation, as described above, even if the degree of the short circuit is small (the short circuit resistance is high), the impedance difference (voltage difference) is clearly produced, so that even if noise is more or less superimposed on the obtained signal, the short circuit can be detected. However, when the short circuit resistance is low, separation with the reactance component is difficult, and thus the case is not suitable for quantification of the short circuit resistance. Therefore, the short circuit state analysis unit 45 compares the calculated difference value of the impedance (or the difference value of the voltage) with the threshold value (step S40).

The threshold value is, for example, a value of the difference value corresponding to an inflection point between the reactance component and the resistance component in the short-circuited circuit when the short circuit resistance is plotted on the horizontal axis and the difference value is plotted on the vertical axis as shown in FIG. 5B described above. Alternatively, it may be a value of the difference value corresponding to a boundary between a region in which the difference value clearly changes in accordance with the change in the short circuit resistance as the region Rcr and a region where the change of the difference value is unclear. Further, it may be a value of the difference value on the high-frequency side corresponding to the upper limit value of the short circuit resistance at which the fluctuation of the measurement value due to noise or the like is small and the short circuit resistance can be accurately estimated on the low-frequency side.

In the case where the calculated difference value is greater than the threshold value set in this way, the short circuit resistance can be accurately estimated on the basis of the measurement result of the AC excitation current at the high frequency. In contrast, in the case where the difference value is less than or equal to the threshold value, the estimation based on the measurement value by the excitation at the low-frequency is suitable.

Therefore, if the difference value is less than the threshold value ("No" in step S40), the short circuit resistance is estimated by applying the difference value of the impedance under the AC excitation current of 6000 Hz to the function (2) described above (step S50). Alternatively, by comparing the relationship between the short circuit resistance and the difference value with analysis data or measurement data stored in advance in a data table or the like, it may be estimated that the short circuit is occurring at what level of short-circuit resistance at the short-circuited pole. Then, on the basis of the estimated value, calculation of the period of use or failure determination is performed (step S100), a short circuit status such as the estimated value is displayed on a display unit (not shown) (step S200), and the process ends.

On the other hand, when the difference value is greater than or equal to the threshold value ("Yes" in step S40), the short circuit state analysis unit 45 instructs the frequency setting unit 41 to set a low frequency of 60 Hz as the frequency (second frequency) on the low frequency side in order to perform quantitative evaluation in the high resistance region. The excitation power supply 2 switches the excitation frequency to the set second frequency and applies the AC excitation current to the field windings (step S60). Then, similarly to steps S20 to S30, the current value at the second frequency and the value of the voltage generated in each of the first pole 9p1 and the second pole 9p2 are detected (step S70), and the impedance of each pole is calculated on the basis of the detected values (step S80).

Also in the second frequency, since a short circuit occurs only in one pole (short-circuited pole), a difference in the voltage values occurs between the poles, and a difference in the impedance can be calculated. Further, since the short circuit resistance is inversely proportional to the impedance difference or the voltage difference in the case of the second frequency, the short circuit resistance can be accurately evaluated quantitatively by applying the obtained difference value to the function (3) (step S90). At the second frequency as well, by comparing the relationship between the short circuit resistance and the difference value with analysis data or measurement data stored in advance in a data table or the like, it may be estimated that the short circuit is occurring at what level of short-circuit resistance at the short-circuited pole. Then, on the basis of the estimated value, calculation of the period of use or the failure determination is performed (step S100), a short circuit status such as the estimated value is displayed on the display unit (not shown) (step S200), and the process ends.

In the above description for the operation, an example is shown in which, on the basis of the model in which one pole is sound and the other pole is short-circuited, the measurement unit 3 calculates the measurement value such as the value of the voltage or impedance in each of the sound pole and the short-circuited pole, and the difference calculation unit 44 estimates the short circuit resistance from the difference value of the calculated measurement value. However, this is not a limitation, for example, measurement data or analysis data in a sound state at the initial stage of the operation may be held in the data holding unit 43, and the difference calculation unit 44 may estimate the short circuit resistance of each pole from the difference value between the held data and the measurement value.

As described above, the short circuit resistance can be estimated quantitatively by the short circuit detection device 1 or the short circuit detection method for the rotating electric machine according to Embodiment 1. As a result, it is possible to select a timing for periodic maintenance or to perform the maintenance on a priority basis, thereby enabling stable operation of the rotating electric machine. Therefore, this is highly effective especially in the case where continuous anomaly monitoring is necessary for a use in which an stoppage of the rotating electric machine due to a failure causes a serious adverse effect on the infrastructure such as electricity, or in the case where maintenance frequency is limited due to a use of the rotating electric machine in a remote place or a use in a large number of rotating electric machines.

Figure 9:
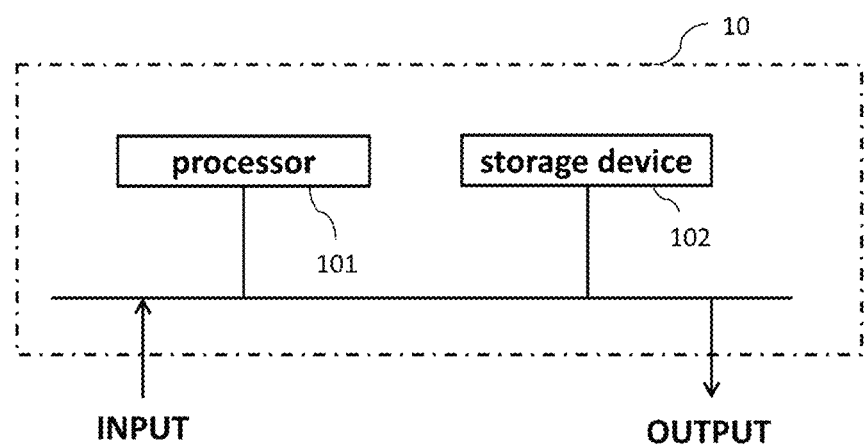
FIG. 9 is a block diagram showing a hardware configuration for implementing a control unit of the short circuit detection device or the short circuit detection method for the rotating electric machine according to Embodiment 1.

Note that, in the short circuit detection device 1 according to Embodiment 1, when a part (for example, the control unit 4) for performing the calculation or the control is referred to as, for example, hardware 10, the hardware 10 includes a processor 101 and a storage device 102 as shown in FIG. 9. The storage device 102 includes a volatile storage device such as a random access memory (not shown) and a non-volatile auxiliary storage device such as a flash memory, also similar to the data holding unit 43. Further, an auxiliary storage device of a hard disk may be provided in place of the flash memory. The processor 101 executes a program input from the storage device 102. In this case, the program is input from the auxiliary storage device to the processor 101 via the volatile storage device. Further, the processor 101 may output data such as calculation results to the volatile storage device of the storage device 102 or may store the data in the auxiliary storage device via the volatile storage device.

Note that, although various exemplary embodiments and examples are described in the present application, a various features, aspects, and a combination of functions described in the embodiments are not limited to the details described in each embodiment, and can be applicable alone or in their various combinations. Accordingly, countless variations that are not illustrated are envisaged within the scope of the art disclosed herein. For example, the case where at least one component is modified, added or omitted, and the case where at least one component is extracted to change a combination are included.

Specifically, the excitation frequency is not limited to the above-described combination of 60 Hz and 6000 Hz, and can be appropriately changed within a range restricted by the diagnosis target apparatus, but for example, a combination of a fundamental frequency (60 Hz) and a frequency corresponding to n times (100 times in this example) thereof is desirable. Further, it is not limited to two types, but three or more types can be used. Although an example is shown in which the range of quantitative evaluation at each frequency is selectively allocated according to whether or not the difference value is larger than the threshold value, this is not a limitation. For example, in a region close to the threshold value, the short circuit resistance may be estimated using each of both frequencies, and weighting may be changed in accordance with the distance from the threshold value. In addition, as a diagnostic target, the structure of the rotating electric machine is not limited to the two poles, and a power generator is not a limitation. Further, the target is not limited to the rotor and may be a stator as long as the field windings are wound. Furthermore, it is also possible to estimate the short circuit resistance not in units of the pole but in units of the slot.

As described above, the short circuit detection device 1 according to the embodiment is configured to comprise the excitation power supply 2 for applying the AC excitation current at a predetermined frequency to the field windings installed in the rotating electric machine (for example, the rotor 9), the difference calculation unit 44 for calculating the difference value between a measurement value of the voltage or impedance in the field windings to which the AC excitation current is applied and a value when the AC excitation current is applied while the field windings are in a sound state, and the short circuit state analysis unit 45 (including the frequency setting unit 41) for comparing the difference value when the AC excitation current is applied at the first frequency (6000 Hz) with the threshold value, estimating the short circuit resistance R from the difference value on the basis of the data (for example, the function (2)) indicating the relationship between the short circuit resistance R and the difference value at the first frequency when the difference value is smaller than the threshold value, the short circuit resistance R being the index of the degree of the short circuit occurring between layers of the field windings, causing the excitation power supply 2 to apply the AC excitation current to the field windings at the second frequency (60 Hz) that is lower than the first frequency when the difference value is equal to or greater than the threshold value, and estimating the short circuit resistance R from a difference value obtained by the AC excitation current at the second frequency on the basis of the data (for example, the function (3)) indicating the relationship between the short circuit resistance R and the difference value at the second frequency. Therefore, the short circuit state in the rotating electric machine can be quantitatively evaluated over a wide range of short circuit resistance values.

Then, when the short circuit state analysis unit 45 is configured to predict the usable period of the rotating electric machine from the estimated value of the short circuit resistance R, it is possible to select the timing for the periodic maintenance or to perform the maintenance on a priority basis, thereby enabling the stable operation of the rotating electric machine. This is highly effective especially in the case where continuous anomaly monitoring is necessary for the use in which an stoppage of the rotating electric machine due to a failure causes a serious adverse effect on the infrastructure such as electricity, or in the case where maintenance frequency is limited due to the use of the rotating electric machine in a remote place or the use in a large number of rotating electric machines.

Further, if the short circuit state analysis unit 45 diagnoses that a short circuit has occurred in the rotating electric machine when the estimated value of the short circuit resistance R is less than the lower limit value, the repair and the maintenance can be performed and the rotating electric machine can be used without anxiety.

Furthermore, when the difference calculation unit 44 calculates the difference as the difference value in the measurement value of the voltage or the impedance between a plurality of sections (for example, the first pole 9p1 section and the second pole 9p2 section) into which the field windings are divided, the short circuit resistance can be easily estimated even when there is no past data or when it is difficult to make analysis data.

Furthermore, as described above, the short circuit detection method according to the embodiment is configured to include an excitation step (steps S10, S60) for applying the AC excitation current to the field windings installed in the rotating electric machine (for example, rotor 9) at a predetermined frequency, and a difference calculation step (steps S20 to S30, steps S70 to S80) for calculating the difference value between a measurement value of the voltage or the impedance in the field windings to which the AC excitation current is applied and a value when the AC excitation current is applied while the field windings are in a sound state, and a short circuit state analysis step (steps S50 and S90) for estimating the short circuit resistance R on the basis of the difference values, the short circuit resistance R being the index of the degree of the short circuit that occurs between the layers of the field windings, wherein, in the short-circuit state analysis step, the difference value when the AC excitation current is applied at the first frequency (6000 Hz) is compared with the threshold value (step S40), the short circuit resistance R (step S50) is estimated from the difference value on the basis of the data indicating the relationship between the short circuit resistance R and the difference value at the first frequency when the difference value is smaller than the threshold value ("No"), the excitation step (step S60) is caused to execute at the second frequency (60 Hz) that is lower than the first frequency when the difference value is equal to or greater than the threshold value ("Yes"), and the short circuit resistance R is estimated from a difference value obtained by the AC excitation current at the second frequency on the basis of the data indicating the relationship between the short circuit resistance R and the difference value at the second frequency (step S90). Therefore, the short circuit state in the rotating electric machine can be quantitatively evaluated over a wide range of short circuit resistance values.

In the short circuit state analysis step (step S100), when it is configured such that the usable period of the rotating electric machine is predicted from the estimated value of the short circuit resistance R, it is possible to select the timing for the periodic maintenance or to perform the maintenance on a priority basis, thereby enabling the stable operation of the rotating electric machine. This is highly effective especially in the case where continuous anomaly monitoring is necessary for the use in which an stoppage of the rotating electric machine due to a failure causes a serious adverse effect on the infrastructure such as electricity, or in the case where maintenance frequency is limited due to the use of the rotating electric machine in a remote place or the use in a large number of rotating electric machines.

In the difference calculation step (steps S20 to S30, steps S70 to S80), when the difference is calculated as the difference value in the measurement value of the voltage or the impedance between a plurality of sections (for example, the first pole 9p1 section and the second pole 9p2 section) into which the field windings are divided, the short circuit resistance can be easily estimated even when there is no past data or when it is difficult to make analysis data.

DESCRIPTION OF REFERENCE NUMERALS AND SIGNS short circuit detection device, 2: excitation power supply, 3: measurement unit, 4: control unit, 41: frequency setting unit, 42: measurement value calculation unit, 43: data holding unit, 44: difference calculation unit, 45: short circuit state analysis unit, 9: rotor, 9c: iron core, 9p1: first pole, 9p2: second pole, 9s: slot, R: short circuit resistance.

The invention claimed is:
1. A short circuit detection device comprising:
an excitation power supply to apply an AC excitation current at a predetermined frequency to field windings installed in a rotating electric machine;
a difference calculator to calculate a difference value between a measurement value of a voltage or an impedance in the field windings to which the AC excitation current is applied and a value when the AC excitation current is applied while the field windings are in a sound state; and a short circuit state analyzer to compare the difference value when the AC excitation current is applied at a first frequency with a threshold value, to estimate a short circuit resistance from the difference value based on data indicating a relationship between the short circuit resistance and the difference value at the first frequency when the difference value is smaller than the threshold value, the short circuit resistance being an index of a degree of a short circuit occurring between layers of the field windings, to cause the excitation power supply to apply the AC excitation current to the field windings at a second frequency that is lower than the first frequency when the difference value is equal to or greater than the threshold value, and to estimate the short circuit resistance from a difference value obtained by the AC excitation current at the second frequency based on data indicating the relationship between the short circuit resistance and the difference value at the second frequency.

2. The short circuit detection device according to claim 1, wherein the short circuit state analyzer estimates a usable period of the rotating electric machine from an estimated value of the short circuit resistance.

3. The short circuit detection device according to claim 1, wherein the short circuit state analyzer diagnoses that the short circuit has occurred in the rotating electric machine when the estimated value of the short circuit resistance is lower than a lower limit value.

4. The short circuit detection device according to claim 2, wherein the short circuit state analyzer diagnoses that the short circuit has occurred in the rotating electric machine when the estimated value of the short circuit resistance is lower than a lower limit value.

5. The short circuit detection device according to claim 1, wherein the difference calculator calculates, as the difference value, a difference in measurement value of the voltage or the impedance between a plurality of sections into Which the field windings are divided.

6. The short circuit detection device according to claim 2, wherein the difference calculator calculates, as the difference value, a difference in measurement value of the voltage or the impedance between a plurality of sections into which the field windings are divided.

7. The short circuit detection device according to claim 3, wherein the difference calculator calculates, as the difference value, a difference in measurement value of the voltage or the impedance between a plurality of sections into which the field windings are divided.

8. The short circuit detection device according to claim 4, wherein the difference calculator calculates, as the difference value, a difference in measurement value of the voltage or the impedance between a plurality of sections into which the field windings are divided.

9. A short circuit detection method for a rotating electric machine comprising:

an excitation step of applying an AC excitation current to field windings installed in the rotating electric machine at a predetermined frequency;

a difference calculation step of calculating a difference value between a measurement value of a voltage or an impedance in the field windings to which the AC excitation current is applied and a value when the AC excitation current is applied while the field windings are in a sound state; and a short circuit state analysis step of estimating a short circuit resistance based on the difference value, the short circuit resistance being an index of a degree of a short circuit that occurs between layers of the field windings, wherein, in the short circuit state analysis step, the difference value when the AC excitation current is applied at a first frequency is compared with a threshold value, the short circuit resistance is estimated from the difference value based on data indicating a relationship between the short circuit resistance and the difference value at the first frequency when the difference value is smaller than the threshold value, the excitation step is caused to execute at a second frequency that is lower than the first frequency when the difference value is equal to or greater than the threshold value, and the short circuit resistance is estimated from a difference value obtained by the AC excitation current at the second frequency based on data indicating a relationship between the short circuit resistance and the difference value at the second frequency.

10. The short circuit detection method for the rotating electric machine according to claim 9, wherein in the short circuit state analysis step, a usable period of the rotating electric machine is predicted from an estimated value of the short circuit resistance.

11. The short circuit detection method for the rotating electric machine according to claim 9, wherein, in the difference calculation step, a difference is calculated as the difference value in measurement value of the voltage or the impedance between a plurality of sections into which the field windings are divided.

12. The short circuit detection method for the rotating electric machine according to claim 10, wherein, in the difference calculation step, a difference is calculated as the difference value in measurement value of the voltage or the impedance between a plurality of sections into which the field windings are divided.

* * * * *